United States Patent
Xia

(10) Patent No.: US 7,825,587 B2
(45) Date of Patent: Nov. 2, 2010

(54) CHARGE TRANSPORTING LAYER FOR ORGANIC ELECTROLUMINESCENT DEVICE

(75) Inventor: Chuanjun Xia, Lawrenceville, NJ (US)

(73) Assignee: Universal Display Corporation, Ewing, NJ (US)

( * ) Notice: Subject to any disclaimer, the term of this patent is extended or adjusted under 35 U.S.C. 154(b) by 432 days.

(21) Appl. No.: 11/513,048

(22) Filed: Aug. 31, 2006

(65) Prior Publication Data
US 2008/0054783 A1    Mar. 6, 2008

(51) Int. Cl.
H01J 1/62        (2006.01)
H01J 63/04       (2006.01)
(52) U.S. Cl. .................. 313/506; 313/504; 313/483; 977/734; 977/735
(58) Field of Classification Search ............ 313/504, 313/483, 498–512; 977/734–753
See application file for complete search history.

(56) References Cited

U.S. PATENT DOCUMENTS

| | | | |
|---|---|---|---|
| 5,929,194 A | 7/1999 | Woo | |
| 6,278,055 B1 | 8/2001 | Forrest et al. | |
| 6,913,710 B2 | 7/2005 | Farrand | |
| 2003/0186077 A1 | 10/2003 | Chen | |
| 2004/0175638 A1 | 9/2004 | Tierney | |
| 2005/0048314 A1 | 3/2005 | Antoniadis et al. | |
| 2005/0158523 A1 | 7/2005 | Gupta | |
| 2006/0105200 A1 | 5/2006 | Poplavskyy et al. | |
| 2006/0115680 A1 | 6/2006 | Hwang et al. | |
| 2006/0177690 A1 | 8/2006 | Su et al. | |
| 2006/0199035 A1* | 9/2006 | Choulis et al. | 428/690 |
| 2006/0240279 A1* | 10/2006 | Adamovich et al. | 428/690 |

FOREIGN PATENT DOCUMENTS

EP    1624503 A2    2/2006
EP    1 753 047      2/2007

OTHER PUBLICATIONS

Lee et al., "The effect of C60 doping on the device performance of organic light-emitting diodes", Lee, et al., "The effect of C60 doping on the device performance of organic light-emitting diodes", Applied Physics Letters 86, pp. 063514-1-3, (2005).

Hong et al., "Effective hole injection of organic light-emitting diodes by introducing buckminsterfullerene on the indium tin oxide anode", Applied Physics Letters 87, pp. 063502-1-3, (2005).

(Continued)

*Primary Examiner*—Nimeshkumar D Patel
*Assistant Examiner*—Thomas A Hollweg
(74) *Attorney, Agent, or Firm*—Kenyon & Kenyon LLP

(57) ABSTRACT

Organic devices comprising an organic layer, wherein the organic layer comprises: (a) a host material formed of a covalently cross-linked matrix comprising an organic charge transport material, and (b) a dopant. The charge transport material has reactive groups for forming cross-links. The cross-linked matrix may allow the organic layer to be solvent resistant. The dopant may protect the cross-linked matrix from electrochemical degradation. The dopant may be a charge acceptor and/or capable of forming covalent bonds with free reactive groups on the cross-linked charge transport material.

24 Claims, 4 Drawing Sheets

OTHER PUBLICATIONS

Wang et al., "Composites of $C_{60}$ based poly (phenylene vinylene) dyad and conjugated polymer for polymer light-emitting devices", Applied Physics Letters, vol. 80, No. 20, pp. 3847-3849, (May 20, 2005).

Williams et al., "Exciton-dopant and exciton-charge interactions in electronically doped OLEDs", Science Direct, Journal of Luminescence, vol. 110, pp. 396-406, (2004).

Domercq et al., "Photo-Patternable Hole-Transport Polymers for Organic Light-Emitting Diodes", Chem. Mater., vol. 15, pp. 1491-1496, (2003).

Nuyken et al., Crosslinkable hole-and electron-transport materials for application in organic light emitting devices (OLEDs):, Designed Monomers and Polymers, vol. 5, No. 2, 3, pp. 195-210, (2002).

Bellmann et al., "New Triarylamine-Containing Polymers as Hole Transport Materials in Organic Light-Emitting Diodes: Effect of Polymer Structure and Cross-Linking on Device Characteristics", Chem. Mater. vol. 10, pp. 1668-1676, (1998).

Muller et al., "Novel cross-linkable hole-transport monomer for use in organic light emitting diodes", Synthetic Metals, vol. 111-112, pp. 31-34, (2000).

Bacher et al., "Photo-Cross-Linked Triphenylenes as Novel Insoluble Hole Transport Materials in Organic LEDs", Macromolecules, vol. 32, pp. 4551-4557, (1999).

Bacher et al., "Synthesis and Characterization of Photo-Cross-Linkable Hole-Conducting Polymers," Macromolecules, vol. 38, pp. 1640-1647 (2005).

Domercq et al., "Organic Light-Emitting Diodes with Multiple Photocrosslinkable Hole-Transport Layers," J. Polymer Sci., vol. 41, pp. 2726-2732 (2003).

Yuan et al., "Fullerene-doped hole trasport molecular films for organic light-emitting Diodes," Appl. Phys. Lett., vol. 86, 143509 (2005).

Jiang et al., "Perfiuorocyclobutane-based arylamine hole transporting materials for polymer and organic light emitting diodes", Adv. Materials vol. 12, pp. 745 (2002).

International Search Report and Written Opinion mailed on Dec. 6, 2007, for PCT/US2007/016726.

\* cited by examiner

CHARGE TRANSPORTING LAYER FOR ORGANIC ELECTROLUMINESCENT DEVICE

The claimed invention was made by, on behalf of, and/or in connection with one or more of the following parties to a joint university corporation research agreement: Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs), and more specifically to organic layers used in such devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule. As used herein, "organic" includes metal complexes of hydrocarbyl and heteroatom-substituted hydrocarbyl ligands.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

SUMMARY OF THE INVENTION

In one aspect, an organic device is provided, comprising: (a) a first electrode; (b) a second electrode; (c) an organic layer disposed between the first electrode and the second electrode, the organic layer comprising: (i) a covalently cross-linked matrix comprising an organic charge transport material, and (ii) a dopant; and (d) an electroluminescent layer disposed between the organic layer and the second electrode.

In another aspect, a method of making an organic device on a substrate is provided, wherein the method comprises: a) providing a first electrode layer disposed over a substrate; b) solution depositing over the first electrode layer, a solution comprising: i) an organic charge transport material having cross-linkable reactive groups, and ii) a dopant; c) forming a first organic layer by cross-linking the organic charge transport material; d) depositing a second organic layer over the first organic layer; and e) providing a second electrode layer disposed over the second organic layer.

DETAILED DESCRIPTION

Figure 1:
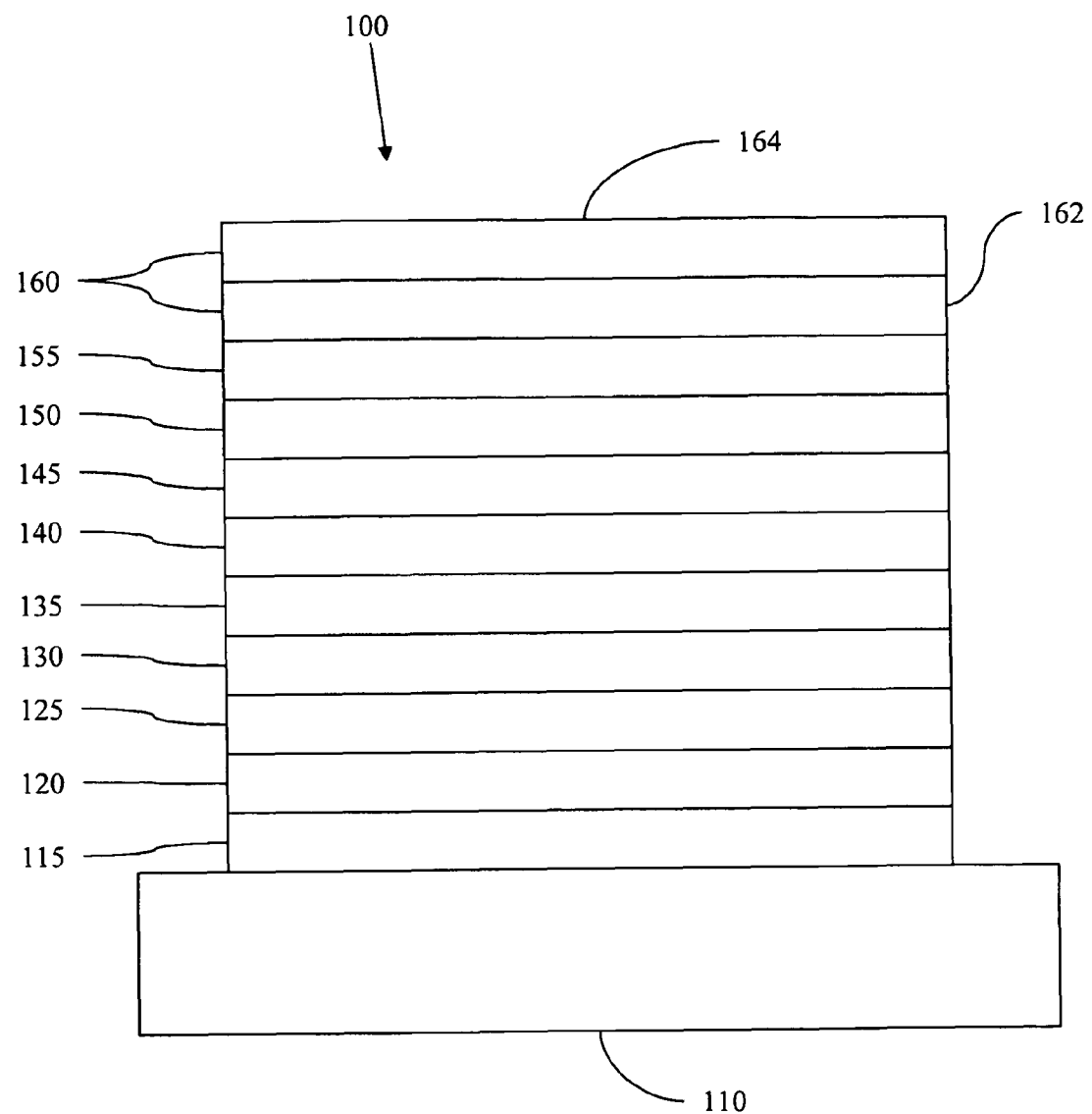
FIG. 1 shows an organic light emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 1, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that an organic material that exhibits phosphorescence at liquid nitrogen temperatures typically does not exhibit phosphorescence at room temperature. But, as demonstrated by Baldo, this problem may be addressed by selecting phosphorescent compounds that do phosphoresce at room temperature. Representative emissive layers include doped or un-doped phosphorescent organometallic materials such as disclosed in U.S. Pat. Nos. 6,303,238 and 6,310,360; U.S. Patent Application Publication Nos. 2002-0034656; 2002-0182441; 2003-0072964; and WO-02/074015.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

As used herein, the term "triplet energy" refers to an energy corresponding to the highest energy feature discernable in the phosphorescence spectrum of a given material. The highest energy feature is not necessarily the peak having the greatest intensity in the phosphorescence spectrum, and could, for example, be a local maximum of a clear shoulder on the high energy side of such a peak.

The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. Nos. 5,844,363 and 6,602,540 B2, which are incorporated by reference in their entireties. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in United States Patent Application Publication No. 2003-0230980 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include $Ir(ppy)_3$. Examples of fluorescent emissive materials include DCM and DMQA. Examples of host materials include $Alq_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. This may be accomplished by several ways: by doping the small molecule into the polymer either as a separate and distinct molecular species; or by incorporating the small molecule into the backbone of the polymer, so as to form a co-polymer; or by bonding the small molecule as a pendant group on the polymer. Other emissive layer materials and structures may be used. For example, a small molecule emissive material may be present as the core of a dendrimer.

Many useful emissive materials include one or more ligands bound to a metal center. A ligand may be referred to as "photoactive" if it contributes directly to the photoactive properties of an organometallic emissive material. A "photoactive" ligand may provide, in conjunction with a metal, the energy levels from which and to which an electron moves when a photon is emitted. Other ligands may be referred to as "ancillary." Ancillary ligands may modify the photoactive properties of the molecule, for example by shifting the energy levels of a photoactive ligand, but ancillary ligands do not directly provide the energy levels involved in light emission. A ligand that is photoactive in one molecule may be ancillary in another. These definitions of photoactive and ancillary are intended as non-limiting theories.

Electron transport layer 145 may include a material capable of transporting electrons. Electron transport layer 145 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in United States Patent Application Publication No. 2003-0230980 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) energy level of the electron transport layer. The "charge carrying component" is the material responsible for the LUMO energy level that actually transports electrons. This component may be the base material, or it may be a dopant. The LUMO energy level of an organic material may be generally characterized by the electron affinity of that material and the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436, 5,707,745, 6,548,956 B2 and 6,576,134 B2, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 145. Blocking layers may also be used to block excitons from diffusing out of the emissive layer. The theory and use of blocking layers is described in more detail in U.S. Pat. No. 6,097,147 and United States Patent Application Publication No. 2003-0230980 to Forrest et al., which are incorporated by reference in their entireties.

As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO energy level that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
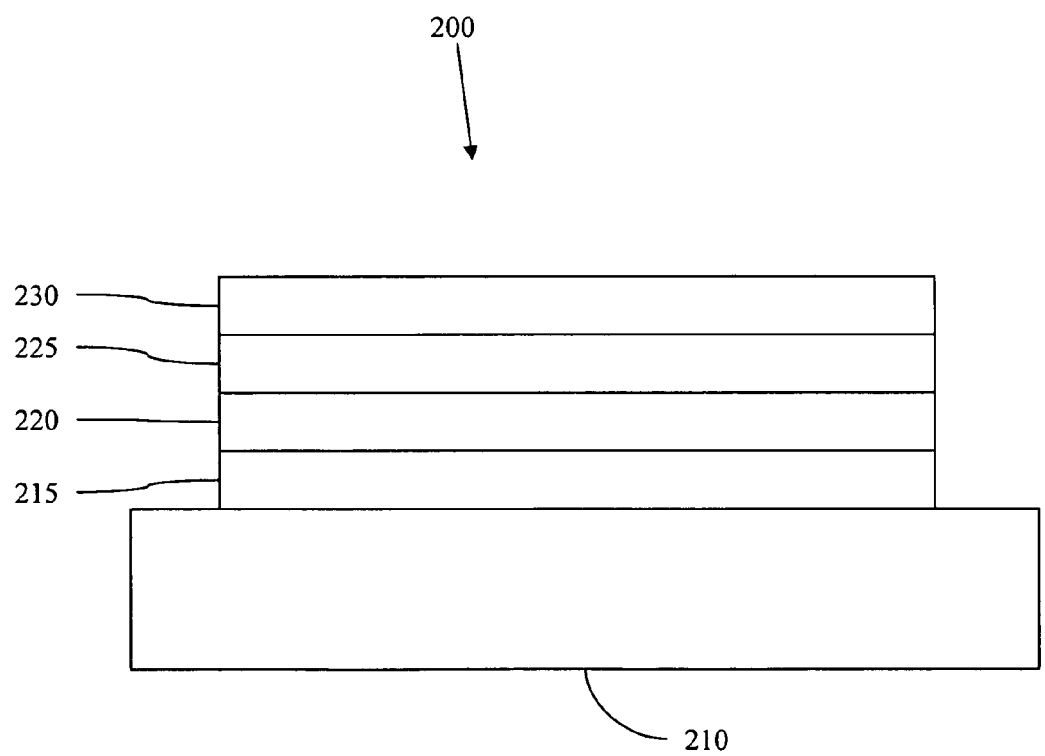
FIG. 2 shows an inverted organic light emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

The molecules disclosed herein may be substituted in a number of different ways without departing from the scope of the invention. For example, substituents may be added to a compound having three bidentate ligands, such that after the substituents are added, one or more of the bidentate ligands are linked together to form, for example, a tetradentate or hexadentate ligand. Other such linkages may be formed. It is believed that this type of linking may increase stability relative to a similar compound without linking, due to what is generally understood in the art as a "chelating effect."

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In one aspect, an organic device is provided comprising an organic layer, wherein the organic layer comprises: (a) a host material formed of a covalently cross-linked matrix comprising an organic charge transport material, and (b) a dopant. The organic device may be an electronic device such as a light-emitting device, field-effect transistor, photovoltaic device, and the like. In an organic light-emitting device, the organic layer may be a charge transport layer such as a hole transport layer, hole injection layer, electron transport layer, or electron injection layer.

The charge transport material may be polymers or organic small molecules that are able to accept and transport charge carriers, which may be holes or electrons, through the organic layer. Many charge transport materials suitable for use in organic devices are known in the art. Non-limiting examples of charge transport materials suitable for use in the present invention include arylamine derivatives such as TPD or NPD.

The charge transport materials have or are modified to have reactive groups which are able to form covalent bond cross-links with another reactive group. As used herein, "reactive group" refers to any atom, functional group, or portion of a molecule having sufficient reactivity to form at least one covalent bond with another reactive group in a chemical reaction. The cross-linking may be between two identical or two different reactive groups. Various reactive groups are known in the art, including but not limited to those derived from amines, imides, amides, alcohols, esters, epoxides, siloxanes, vinyl, and strained ring compounds. Examples of such reactive groups include oxetane, styrene, and acrylate functional groups. Charge transport materials having such cross-linkable reactive groups are described in Nuyken et al., *Designed Monomers and Polymers* 5(2/3): 195-210 (2002); Bacher et al., *Macromolecules* 32:4551-57 (1999); Bellmann et al., *Chem. Mater.* 10:1668-76 (1998); Domercq et al., *Chem. Mater.* 15:1491-96 (2003); Muller et al., *Synthetic Metals* 111/112:31-34 (2000); Bacher et al., *Macromolecules* 38:1640-47 (2005); and Domercq et al., *J. Polymer Sci.* 41:2726-32 (2003), U.S. Patent Publication Nos. 2004/0175638 (Tierney et al.) and 2005/0158523 (Gupta et al.); and U.S. Pat. No. 5,929,194 (Woo et al.) and U.S. Pat. No. 6,913,710 (Farrand et al.), which are all incorporated by reference herein. In certain instances, styryl group-bearing arylamine derivatives such as $N^4,N^{4'}$-di(naphthalen-1-yl)-$N^4,N^{4'}$-bis(4-vinylphenyl)biphenyl-4,4'-diamine:

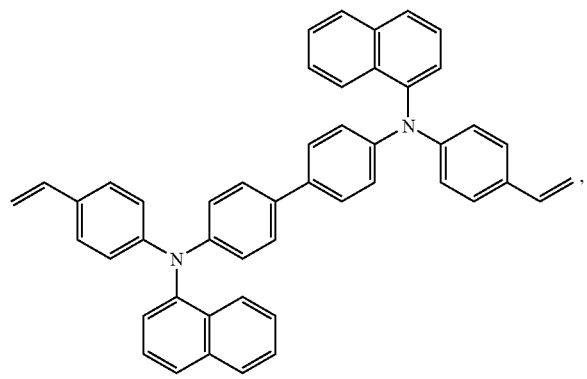

are preferred as charge transport materials because they have moderate cross-linking temperatures. Also preferred are charge transport materials that have good film formation properties and that do not exhibit large volume changes upon cross-linking.

Cross-linking is performed by exposing the charge transport material to heat and/or actinic radiation, including UV light, gamma rays, or x-rays. Cross-linking may be carried out in the presence of an initiator that decomposes under heat or irradiation to produce free radicals or ions that initiate the cross-linking reaction. The cross-linking may be performed in-situ during fabrication of the device.

Cross-linked organic layers have been found to be solvent resistant. See U.S. Pat. No. 5,929,194 (Woo et al.), which is incorporated by reference herein. An organic layer formed of a covalently cross-linked matrix can be useful in the fabrication of organic devices by solution processing techniques, such as spin coating, spray coating, dip coating, ink jet, and the like. In solution processing, the organic layers are deposited in a solvent. Therefore, in a multi-layered structure, any underlying layer is preferably resistant to the solvent that is being deposited upon it.

Thus, in certain instances, the cross-linking of the charge transport material can render the organic layer resistant to solvents. As such, the organic layer can avoid being dissolved, morphologically influenced, or degraded by a solvent that is deposited over it. The organic layer may be resistant to a variety of solvents used in the fabrication of organic devices, including toluene, xylene, anisole, and other substituted aromatic and aliphatic solvents. The process of solution deposition and cross-linking can be repeated to create a multilayered structure.

A molecular film for organic light-emitting diodes formed of NPB and doped with $C_{60}$ is described in Yuan et al., *Applied Physics Lett.* 86:143509[1-3] (2005), which is incorporated by reference herein. In this molecular film, a strong dipole interaction between the NPB and $C_{60}$ provides a dipole force cross-linking, which enhances the thermal stability of the molecular film. Such dipole force cross-linking by the dopant is rendered unnecessary by the covalent cross-linking between the reactive groups on the charge transport material. Molecules having reactive groups have different characteristics pertinent to their use in OLEDs, including electrochemical stability, than molecules such as NPB which do not have reactive groups.

The organic layer further comprises a dopant, which may be included in the organic layer in various ways. In certain instances, the dopant is a separate and distinct molecular species from the host material. In other instances, the dopant is incorporated into the host material. Incorporation of the dopant into the host material may be accomplished by bonding the dopant as a pendant group on the charge transport material, or by incorporating the dopant into the backbone of a polymeric charge transport material, so as to form a co-polymer. Various amounts of dopants may be used in the organic layer. Preferably, the dopant is present in an amount ranging from 1 to 49 wt %, and more preferably from about 5 to about 40 wt %.

Various organic or organometallic dopants suitable for use in organic devices are known in the art. In certain instances, the dopant is selected for its ability to protect the cross-linked matrix from electrochemical degradation, which is important in improving the lifetime of the device. Charge transport materials may be vulnerable to electron or hole attack, as described in Lee et al., *Applied Physics Lett.* 86:063514[1-3] (2005), which is incorporated by reference herein. Trapping excess holes and electrons injected from the light-emitting layer has been shown to stabilize the charge transporting layer. Reactive groups on the charge transport materials, whether free or crosslinked, may also be vulnerable to electron or hole attack.

Thus, in certain instances, dopants which can act as charge acceptors are preferred. As used herein, "charge acceptor" is a relative term that describes the affinity of the dopant for a charge carrier with respect to the charge transport material in the organic layer. The dopant can be a hole acceptor or an electron acceptor. A dopant is an "electron acceptor" relative to a charge transport material into which it is doped if the dopant has a LUMO that is lower than the LUMO of the charge transport material. A dopant is a "hole acceptor" relative to a charge transport material into which it is doped if the dopant has a HOMO that is higher than the HOMO of the charge transport material. This terminology is not necessarily consistent with that used in the different context of an organic "acceptor/donor junction." Where the dopant acts as a charge acceptor, an energy level difference of at least 0.3 eV between the dopant and the charge transport material is preferred.

Preferably, the charge acceptor has an affinity for a charge carrier of a different polarity than the charge carrier that is being transported by the charge transport material. For example, an electron acceptor would be preferred as a dopant in a hole transport layer. Various dopants which function as charge acceptors and which are suitable for use in the present invention are known in the art, including fullerenes such as $C_{60}$, $C_{60}$ derivatives such as {6}-1-(3-(methoxycarbonyl)propyl)-{5}-1-phenyl-[6,6]-C61:

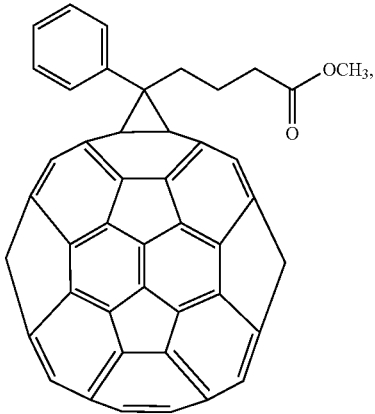

and the fullerene derivatives described in Wang et al., *Applied Physics Lett.* 80(20):3847-49 (2002), which is incorporated by reference herein.

Free (non-cross-linked) reactive groups on the charge transport material may be particularly vulnerable to attack by charge carriers, reducing the stability of the organic layer. For example, chemical reactions may take place between the charge carriers and the residual free reactive groups. Therefore, in certain instances, dopants that are able to form covalent bonds with free reactive groups on the charge transport material are preferred. By "capping" the free reactive groups in such a manner, the reactive groups are rendered inert, non-reactive, or otherwise less vulnerable to attack by charge carriers. Various dopants having the ability to covalently bond with free reactive groups and which are suitable for use in the present invention are known in the art, including $C_{60}$ derivatives.

One of the problems associated with the use of dopants in the charge transport layers of OLEDs is diffusion of the dopant into the emissive layer, which can cause quenching of the electroluminescence. Some dopants, such as $C_{60}$, have a particularly strong quenching effect. See Williams et al., *J. Luminescence* 110:396-406 (2004), which is incorporated by reference herein.

Thus, in certain instances, the dopant is immobilized within the cross-linked matrix of the host material. The dopant may be immobilized by various types of interactions with the host material, such as physical entrapment within the cross-linked matrix or dipole interactions with the host material. In certain instances, dopants which are able to have dipole interactions with the host material are preferred, including $C_{60}$ and its derivatives. Immobilization of the dopant in the organic layer reduces dopant diffusion into the emissive layer, thus lessening the quenching effect.

EXPERIMENTAL

Specific representative embodiments of the invention will now be described, including how such embodiments may be made. It is understood that the specific methods, materials, conditions, process parameters, apparatus and the like do not necessarily limit the scope of the invention.

All example organic light-emitting devices were fabricated using spin-coating and vacuum thermal evaporation. The devices were fabricated on a glass substrate precoated with a 120 nm thick anode of indium tin oxide (ITO). The cathode was a 0.7 nm layer of LiF followed by 100 nm of aluminum. All devices were encapsulated with a glass lid sealed with an epoxy resin under nitrogen (<1 ppm $H_2O$ and $O_2$) immediately after fabrication, and a moisture getter was incorporated inside the encapsulated region of the devices.

For the device of Example 1, the organic stack was fabricated to consist of CuPc (copper phthalocyanine) as a hole injection layer at a thickness of 10 nm; $N^4,N^{4'}$-di(naphthalen-1-yl)-$N^4,N^{4'}$-bis(4-vinylphenyl)biphenyl-4,4'-diamine as a hole transport layer at a thickness of 25 nm; 3,5-di(9H-carbazol-9-yl)biphenyl doped with tris(2-(biphenyl-3-yl)-4-tert-butylpyridine)iridium(III) as the emissive layer at a thickness of 35 nm; BAlq [aluminum(III)bis(2-methyl-8-hydroxyquinolinato)4-phenylphenolate] as a first electron transport layer (ETL1) at a thickness of 15 nm; and $Alq_3$ [aluminum(III)tris(8-hydroxyquinoline)] as a second electron transport layer (ETL2) at a thickness of 40 nm.

The hole transport layer and the emissive layer were deposited by spin coating. For the hole transport layer, a 0.5 wt % solution of $N^4,N^{4'}$-di(naphthalen-1-yl)-$N^4,N^{4'}$-bis(4-vinylphenyl)biphenyl-4,4'-diamine was spin-coated onto the hole injection layer at 1500 rpm for 30 seconds. The film was then baked at 200° C. for 30 minutes on a hot plate in a nitrogen glovebox. The film became insoluble after baking. After cooling to room temperature, the emissive layer was deposited by spin-coating a solution of 0.75 wt % 3,5-di(9H-carbazol-9-yl)biphenyl and 12 wt % tris(2-(biphenyl-3-yl)-4-tert-butylpyridine)iridium(III) onto the hole transport layer at 1000 rpm for 30 seconds. The emissive layer was then baked at 100° C. for one hour. The other layers were deposited by vacuum thermal evaporation.

Figure 3:
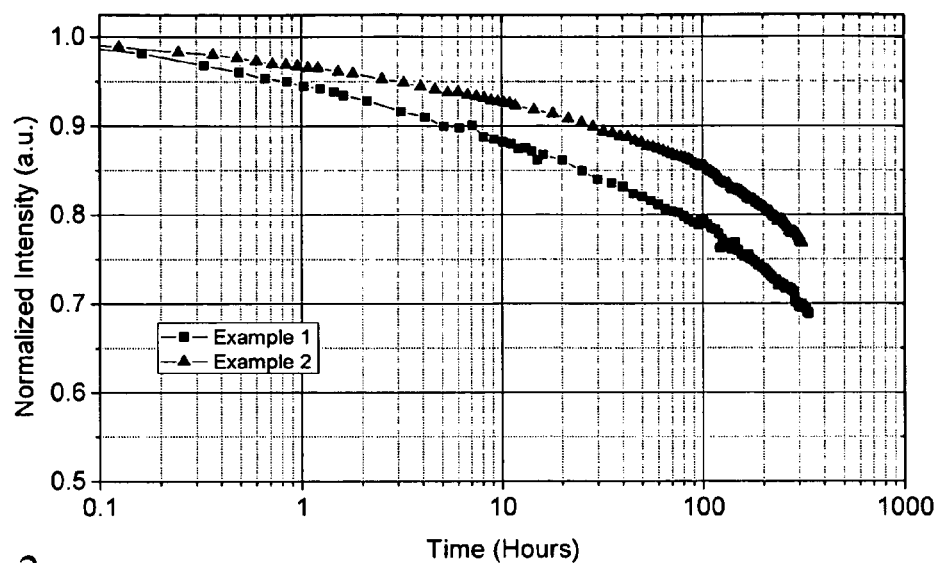
FIG. 3 shows a plot of luminance as a function of time for the devices of Examples 1 and 2.

The device of Example 2 was fabricated in the same manner as the device of Example 1, except that the hole transport layer was doped with 10 wt % of the $C_{60}$ derivative, {6}-1-(3-(methoxycarbonyl)propyl)-{5}-1-phenyl-[6,6]-C61. Both devices were operated under a DC current producing an initial brightness of 1000 cd/m². Device lifetime here is defined as the time elapsed for the luminance to decay to 80% of the initial level, at room temperature under constant DC drive. FIG. 3 shows a plot of luminance as a function of time for the devices of Examples 1 and 2. The lifetime of the device with the undoped hole transport layer (Example 1) was 71 hours, as compared to 220 hours for the device with the $C_{60}$ derivative dopant (Example 2). Table 1 below summarizes the hole transport layer composition of the example devices and their lifetimes.

TABLE 1

| Example | HTL Layer | Device Lifetime (hours) |
|---|---|---|
| 1 | $N^4,N^{4'}$-di(naphthalen-1-yl)-$N^4,N^{4'}$-bis(4-vinylphenyl)biphenyl-4,4'-diamine | 71 |
| 2 | $N^4,N^{4'}$-di(naphthalen-1-yl)-$N^4,N^{4'}$-bis(4-vinylphenyl)biphenyl-4,4'-diamine + $C_{60}$ derivative | 220 |

Figure 4:
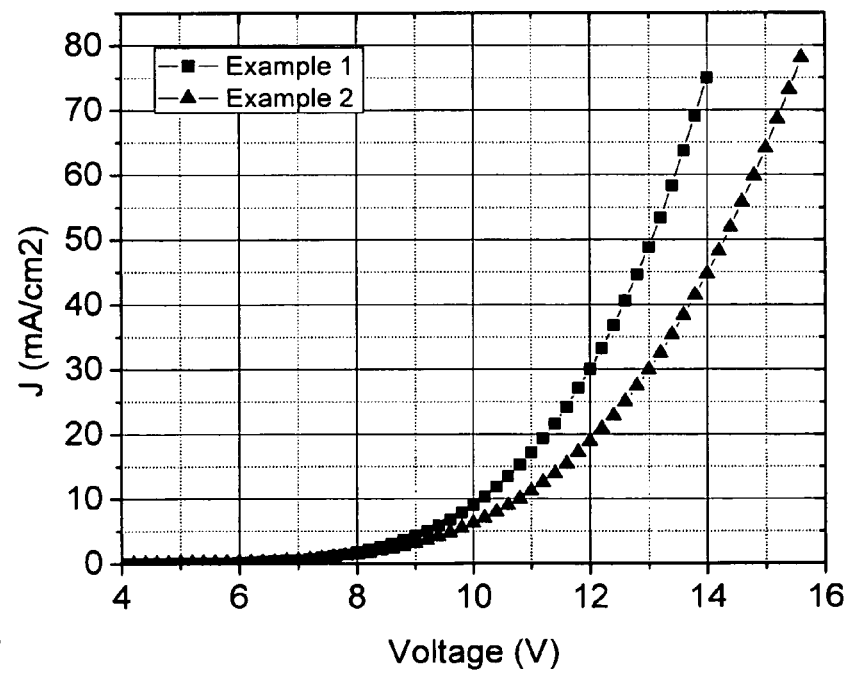
FIG. 4 shows a plot of current density as a function of voltage for the devices of Examples 1 and 2.
Figure 5:
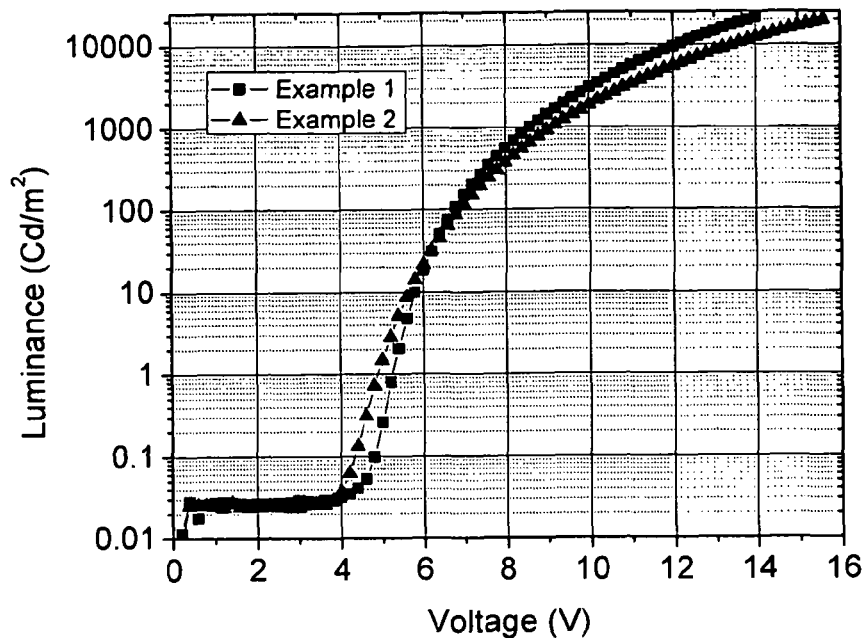
FIG. 5 shows a plot of luminance as a function of voltage for the devices of Examples 1 and 2.
Figure 6:
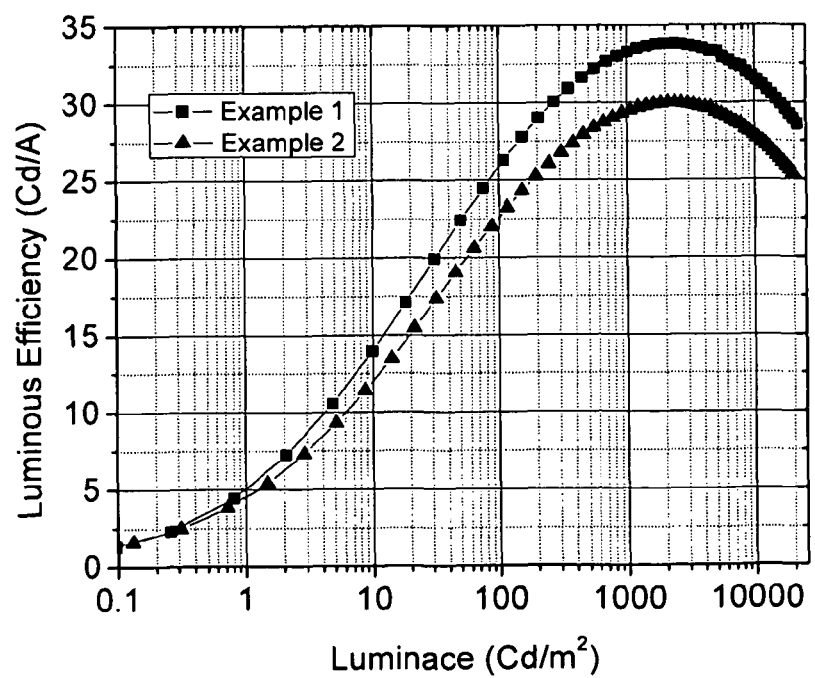
FIG. 6 shows a plot of luminance efficiency as a function of luminance for the devices of Examples 1 and 2.

As shown in FIGS. 4-6, doping of the hole transport layer with the $C_{60}$ derivative in Example 2 does not significantly reduce the efficiency or performance of the device compared to Example 1.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

MATERIAL DEFINITIONS

As used herein, abbreviations refer to materials as follows:
CBP: 4,4'-N,N-dicarbazole-biphenyl
m-MTDATA 4,4',4''-tris(3-methylphenylphenlyamino)triphenylamine
$Alq_3$: aluminum(III)tris(8-hydroxyquinoline)
Bphen: 4,7-diphenyl-1,10-phenanthroline
n-BPhen: n-doped BPhen (doped with lithium)
$F_4$-TCNQ: tetrafluoro-tetracyano-quinodimethane
p-MTDATA: p-doped m-MTDATA (doped with $F_4$-TCNQ)
$Ir(ppy)_3$: tris(2-phenylpyridine)-iridium
$Ir(Ppz)_3$: tris(1-phenylpyrazoloto,N,C(2')iridium(III)
BCP: 2,9-dimethyl-4,7-diphenyl-1,10-phenanthroline
TAZ: 3-phenyl-4-(1'-naphthyl)-5-phenyl-1,2,4-triazole
CuPc: copper phthalocyanine.
ITO: indium tin oxide
NPD: N,N'-diphenyl-N-N'-di(1-naphthyl)-benzidine
TPD: N,N'-diphenyl-N-N'-di(3-toly)-benzidine
BAlq: aluminum(III)bis(2-methyl-8-hydroxyquinolinato)4-phenylphenolate
mCP: 1,3-N,N-dicarbazole-benzene
DCM: 4-(dicyanoethylene)-6-(4-dimethylaminostyryl-2-methyl)-4H-pyran
DMQA: N,N'-dimethylquinacridone
PEDOT:PSS: an aqueous dispersion of poly(3,4-ethylenedioxythiophene) with polystyrenesulfonate (PSS)

What is claimed is:

1. An organic device comprising:
   a first electrode;
   a second electrode;
   an organic layer disposed between the first electrode and the second electrode, the organic layer comprising:
      (i) a covalently cross-linked matrix comprising an organic charge transport material, and
      (ii) a dopant that is covalently bonded to the cross-linked matrix, wherein the dopant is a fullerene or a fullerene derivative, and wherein the concentration of the dopant in the organic layer is in the range of 5-40 wt % of the organic layer; and
   an electroluminescent layer disposed between the organic layer and the second electrode;
   wherein the lifetime of the device, as measured by the time for luminance decay to 80% of the initial luminance level, is at least 220 hours.

2. The device of claim 1, wherein the charge transport material has reactive groups, and wherein the cross-linked matrix is formed by cross-linking of the reactive groups, and wherein the dopant is covalently bonded to non-cross-linked reactive groups on the charge transport material.

3. The device of claim 1, wherein the dopant protects the cross-linked matrix from electrochemical degradation.

4. The device of claim 3, wherein the dopant is a charge acceptor.

5. The device of claim 4, wherein the dopant is a charge acceptor for a first type of charge carrier and the charge transport material transports a second type of charge carrier, and wherein the polarity of the first type of charge carrier is different from the polarity of the second type of charge carrier.

6. The device of claim 5, wherein the dopant is an electron acceptor and the charge transport material transports holes.

7. The device of claim 6, wherein the energy level of the lowest unoccupied molecular orbital of the dopant is lower than the energy level of the lowest unoccupied molecular orbital of the charge transport material.

8. The device of claim 7, wherein the difference in the energy levels of the lowest unoccupied molecular orbital of the dopant and the lowest unoccupied molecular orbital of the charge transport material is greater than 0.3 eV.

9. The device of claim 1, wherein the dopant is immobilized within the cross-linked matrix.

10. The device of claim 9, wherein the luminous efficiency of the electroluminescent layer is not substantially affected by the dopant.

11. The device of claim 1, wherein the organic layer is in direct contact with the electroluminescent layer.

12. The device of claim 1, wherein the first electrode is an anode, the second electrode is a cathode, and the charge transport material is a hole transport material.

13. The device of claim 12, wherein the organic layer is insoluble in an organic solvent.

14. The device of claim 1, wherein the organic layer is insoluble in an organic solvent.

15. The device of claim 14, wherein the organic solvent is a substituted aromatic or aliphatic solvent.

16. The device of claim 1, wherein the organic layer is fabricated by deposition of an organic solution containing the charge transport material.

17. The device of claim 1, wherein the device is selected from the group consisting of a light-emitting device, field-effect transistor, and photovoltaic device.

18. A method of making an organic device on a substrate comprising:
   a) providing a first electrode layer disposed over a substrate;
   b) solution depositing over the first electrode layer, a solution comprising:
      i) an organic charge transport material having cross-linkable reactive groups, and
      ii) a dopant that is a fullerene or a fullerene derivative;
   c) forming a first organic layer by cross-linking the organic charge transport material and covalently bonding the dopant to the non-cross-linked reactive groups on the organic charge transport material, wherein the concentration of the dopant in the first organic layer is in the range of 5-40 wt % of the first organic layer;
   d) depositing a second organic layer over the first organic layer; and
   e) providing a second electrode layer disposed over the second organic layer;
   wherein the lifetime of the device, as measured by the time for luminance decay to 80% of the initial luminance level, is at least 220 hours.

19. The method of claim 18, wherein the cross-linking is performed by heat curing.

20. The method of claim 18, wherein the dopant is a charge acceptor.

21. The method of claim 18, wherein the first electrode is an anode, the second electrode is a cathode, and the charge transport material is a hole transport material.

22. The method of claim 18, wherein depositing the second organic layer is performed by solution deposition.

23. The method of claim 22, wherein the solution deposition of the second organic layer uses a solvent, and wherein the first organic layer is insoluble in the solvent used in the solution deposition.

24. The method of claim 18, wherein the second organic layer is an electroluminescent layer, and wherein the electroluminescent layer is deposited directly onto the first organic layer.

* * * * *